United States Patent
Ahn et al.

(10) Patent No.: US 8,404,579 B2
(45) Date of Patent: Mar. 26, 2013

(54) METHODS OF FORMING INTEGRATED CIRCUIT DEVICES WITH CRACK-RESISTANT FUSE STRUCTURES

(75) Inventors: Sang-Hoon Ahn, Hwaseong-si (KR); Gil-Heyun Choi, Seoul (KR); Jong-Myeong Lee, Seongnam-si (KR); Sang-Don Nam, Seoul (KR); Kyu-Hee Han, Incheon (KR)

(73) Assignee: Samsung Electronics Co., Ltd. (KR)

( * ) Notice: Subject to any disclaimer, the term of this patent is extended or adjusted under 35 U.S.C. 154(b) by 105 days.

(21) Appl. No.: 12/960,150

(22) Filed: Dec. 3, 2010

(65) Prior Publication Data
US 2011/0136332 A1 Jun. 9, 2011

(30) Foreign Application Priority Data
Dec. 4, 2009 (KR) .................. 10-2009-0119506

(51) Int. Cl.
*H01L 21/44* (2006.01)
(52) U.S. Cl. .................. 438/601; 257/E21.592
(58) Field of Classification Search .................. 438/597, 438/601; 257/E23.149, E21.592
See application file for complete search history.

(56) References Cited

U.S. PATENT DOCUMENTS

| | | | |
|---|---|---|---|
| 6,509,255 B2 * | 1/2003 | Minn et al. | 438/601 |
| 6,696,353 B2 * | 2/2004 | Minn et al. | 438/462 |
| 7,704,804 B2 * | 4/2010 | Daubenspeck et al. | 438/132 |
| 7,785,935 B2 * | 8/2010 | Bosholm et al. | 438/132 |
| 2001/0005604 A1 * | 6/2001 | Lee et al. | 438/132 |
| 2009/0149013 A1 * | 6/2009 | Daubenspeck et al. | 438/601 |

FOREIGN PATENT DOCUMENTS

| | | |
|---|---|---|
| JP | 2004-146598 | 5/2004 |
| KR | 10-2003-0049557 | 6/2003 |
| KR | 10-2005-0054066 | 6/2005 |

* cited by examiner

*Primary Examiner* — Thao P. Le
(74) *Attorney, Agent, or Firm* — Myers Bigel Sibley & Sajovec, P.A.

(57) ABSTRACT

A fuse base insulating region, for example, an insulating interlayer or a compensation region disposed in an insulating interlayer, is formed on a substrate. An etch stop layer is formed on the fuse base insulating region and forming an insulating interlayer having a lower dielectric constant than the first fuse base insulating region on the etch stop layer. A trench extending through the insulating interlayer and the etch stop layer and at least partially into the fuse base insulating region is formed. A fuse is formed in the trench. The fuse base insulating region may have a greater mechanical strength and/or density than the second insulating interlayer.

19 Claims, 8 Drawing Sheets

METHODS OF FORMING INTEGRATED CIRCUIT DEVICES WITH CRACK-RESISTANT FUSE STRUCTURES

CLAIM OF PRIORITY

This application claims priority under 35 USC §119 to Korean Patent Application No. 10-2009-0119506 filed on Dec. 4, 2009 in the Korean Intellectual Property Office (KIPO), the contents of which are herein incorporated by reference in their entirety.

BACKGROUND

1. Field

Some example embodiments relate to integrated circuit devices and methods of forming the same and, more particularly, to integrated circuit devices with fuse structures and methods of forming the same.

2. Description of the Related Art

Generally, an integrated circuit device may be manufactured by processing, electrical die sorting (EDS), assembling and testing. The EDS may include a pre-laser test for testing semiconductor chips, a laser repair in which redundant chips are substituted for bad chips, and a post-laser test in which the substitutes are tested. The laser repair may be performed by cutting fuses connected to the bad chips and substituting the redundant chips for the bad chips. The fuses may include polysilicon and metal, and are often formed using a copper damascene process.

SUMMARY

In some embodiments, methods include forming a fuse base insulating region on a substrate. The fuse base insulating region may include, for example, an insulating interlayer or a compensation region formed in such an insulating interlayer. An etch stop layer is formed on the fuse base insulating region. An insulating interlayer having a lower dielectric constant than the fuse base insulating region is formed on the etch stop layer. A trench is formed extending through the insulating interlayer and the etch stop layer and at least partially into the fuse base insulating region. A fuse is formed in the trench. The fuse base insulating region may have a greater mechanical strength and/or density than the second insulating interlayer.

In some embodiments, forming a fuse base insulating region includes forming a first insulating interlayer and forming an insulating interlayer includes forming a second insulating interlayer having a lower dielectric constant than the first insulating interlayer. Forming a trench includes forming a trench extending through the second insulating interlayer and the etch stop layer and at least partially into the first insulating interlayer. The first insulating interlayer may have a greater mechanical strength and/or density than the second insulating interlayer.

In further embodiments, forming a fuse base insulating region includes forming a first insulating interlayer and forming a compensation region in the first insulating interlayer. Forming an insulating interlayer layer includes forming a second insulating interlayer having a lower dielectric constant than the compensation region. Forming a trench includes forming a trench extending through the second insulating interlayer and the etch stop layer and at least partially into the compensation region. The compensation region may have a greater mechanical strength and/or density than the second insulating interlayer. The compensation region may have a greater dielectric constant, mechanical strength and/or density than the first insulating interlayer. The compensation region may be formed by, for example, implanting ions into a portion of the first insulating interlayer, exposing a portion of the first insulating interlayer to ultraviolet radiation or by removing a portion of the first insulating interlayer to form a trench and depositing an insulating material in the trench to form the compensation region.

In some embodiments, methods include forming a first insulating interlayer on a substrate, forming a wiring pattern in the first insulating interlayer, forming an etch stop layer on the first insulating interlayer and the wiring pattern and forming a second insulating interlayer having a lower dielectric constant than the first insulating interlayer on the etch stop layer. A hole and a first trench through the second insulating interlayer are formed to expose portions of the etch stop layer overlying the wiring pattern and a laterally adjacent portion of the first insulating interlayer, respectively. A second trench in fluid communication with the hole in the second insulating interlayer is formed. Portions of the etch stop layer exposed by the hole and the first trench are removed to expose the wiring pattern and the laterally adjacent portion of the first insulating interlayer. A contact plug is formed in the second trench and the hole and a fuse is formed in the first trench. Removing the portions of the etch stop layer exposed by the hole and the first trench may include removing an upper portion of the first insulating interlayer and the fuse may extend at least partially into the first insulating interlayer.

In additional embodiments, methods include forming a first insulating interlayer on a substrate, forming a first wiring pattern in the first insulating interlayer and forming a second insulating interlayer having a dielectric constant lower than the first insulating interlayer on the first insulating interlayer. A first trench is formed extending partially into the second insulating interlayer, overlying the first wiring pattern. A hole and a second trench are formed in the second insulating interlayer, the hole passing from the first trench through the second insulating interlayer to expose the first wiring pattern and the second trench laterally adjacent the first trench and passing through the second insulating interlayer and at least partially into the first insulating interlayer. A contact plug and a second wiring pattern are formed in the hole and the first trench, respectively, and a fuse is formed in the second trench.

In further embodiments, methods include forming a first insulating layer on a substrate and forming a compensation region in the first insulating layer, the compensation region having a greater mechanical strength than the first insulating layer. A second insulating layer is formed on the first insulating layer and the compensation region. A trench is formed extending through the second insulating layer and at least partially into the compensation region. A fuse is formed in the trench.

Further embodiments provide integrated circuit devices. The devices include a first insulating interlayer on a substrate, a first wiring pattern in the first insulating interlayer and a second insulating interlayer on the first insulating interlayer and the first wiring pattern. The devices further include a second wiring pattern in the second insulating interlayer overlying and in electrical contact with the first wiring pattern and a fuse extending through the second insulating interlayer and at least partially into the first insulating interlayer. The first insulating interlayer has a greater mechanical strength than the second insulating interlayer.

In additional embodiments, integrated circuit devices include a first insulating interlayer on a substrate, a compensation region in the first insulating interlayer and having a greater mechanical strength than the first insulating interlayer and a second insulating interlayer on the first insulating interlayer and the compensation region. The devices further include a fuse extending through the second insulating interlayer and at least partially into the compensation region.

BRIEF DESCRIPTION OF THE DRAWINGS

Some example embodiments will be more clearly understood from the following detailed description taken in conjunction with the accompanying drawings. FIGS. 1 to 42 represent non-limiting example embodiments as described herein.

DETAILED DESCRIPTION OF THE EMBODIMENTS

Various example embodiments will be described more fully hereinafter with reference to the accompanying drawings, in which some example embodiments are shown. The present inventive subject matter may, however, be embodied in many different forms and should not be construed as limited to the example embodiments set forth herein. Rather, these example embodiments are provided so that this description will be thorough and complete, and will fully convey the scope of the present inventive subject matter to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive subject matter.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some example embodiments will be explained in detail with reference to the accompanying drawings.

FIGS. 1 to 6 are cross-sectional views illustrating a method of forming a fuse structure in accordance with some example embodiments.

Figure 1:
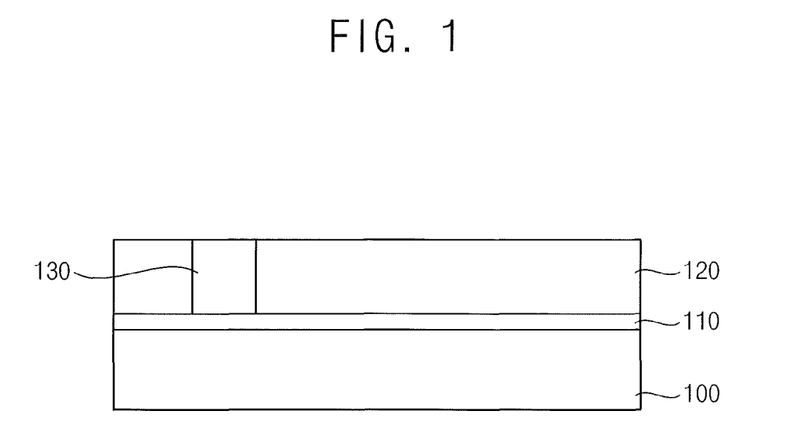
FIGS. 1 to 6 are cross-sectional views illustrating a method of forming a fuse structure in accordance with some example embodiments.

Referring to FIG. 1, a first etch stop layer 110 and a first insulating interlayer 120 may be sequentially formed on a substrate 100.

The substrate 100 may include a semiconductor substrate, e.g., a silicon substrate, a germanium substrate, a silicon-germanium substrate, a silicon-on-insulator (SOI) substrate, a germanium-on-insulator (GOI) substrate, and the like. Various types of circuit elements such as transistors, capacitors or wirings may be formed on the substrate 100, and an insulation layer (not shown) may be further formed between the substrate 100 and the first etch stop layer 110.

The first etch stop layer 110 may be formed using a material having a high etching selectivity with respect to the first insulating interlayer 120. For example, the first etch stop layer 110 may be formed using a silicon nitride such as silicon carbonitride.

The first insulating interlayer 120 may be formed using a material having a higher mechanical strength or density than that of a second insulating interlayer 150 that may be illustrated with reference to FIG. 2. For example, the first insulating interlayer 120 may be formed using silicon oxide, silicon nitride, silicon oxynitride, or silicon carboxide having a high density. In some example embodiments, the first insulating interlayer 120 may be formed to have a high dielectric constant more than about 3.5. For example, the first insulating interlayer 120 may be formed using silicon oxide doped with fluorine having a high dielectric constant more than about 3.5.

An opening (not shown) exposing a portion of the first etch stop layer 110 may be formed through the first insulating interlayer 120, and a first wiring 130 may be formed on the exposed portion of the first etch stop layer 110 to fill the opening. The opening may be formed by a photolithography process using a photoresist pattern. Particularly, a hard mask layer (not shown) may be formed on the first insulating interlayer 120, and the hard mask layer may be patterned to form a hard mask (not shown) using the photoresist pattern as an etching mask. Thus, the hard mask may serve as an etching mask for forming the opening. The first wiring 130 may be formed using a metal or polysilicon. In some example embodiments, the first wiring 130 may be formed by a copper damascene process. A barrier layer (not shown) may be further formed between the first insulating interlayer 120 and the first wiring 130. The barrier layer may be formed using a metal nitride.

Figure 2:
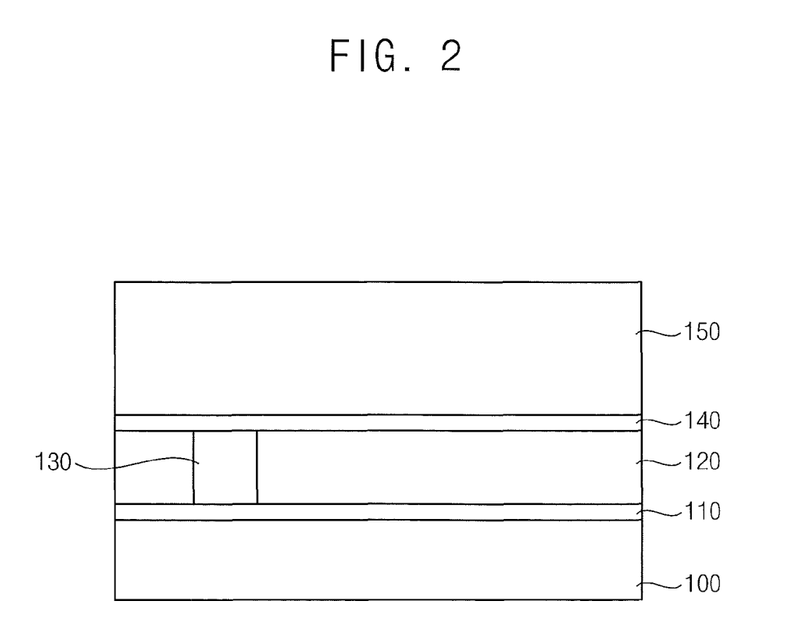

Referring to FIG. 2, a second etch stop layer 140 and a second insulating interlayer 150 may be sequentially formed on the first insulating interlayer 120 and the first wiring 130.

The second etch stop layer 140 may be formed using a material having a high etching selectivity with respect to the second insulating interlayer 150. The second etch stop layer 140 may be formed using a material substantially the same as or different from that of the first etch stop layer 110.

The second insulating interlayer 150 may be formed using a material having a low dielectric constant, for example, a dielectric constant less than about 3.5. Thus, a parasitic capacitance between wirings in the second insulating interlayer 150 may be low. For example, the second insulating interlayer 150 may be formed using silicon oxide doped with carbon or fluorine or porous silicon carboxide. The second insulating interlayer 150 may include an insulating material having a modulus equal to or less than about 50 GPa.

Figure 3:
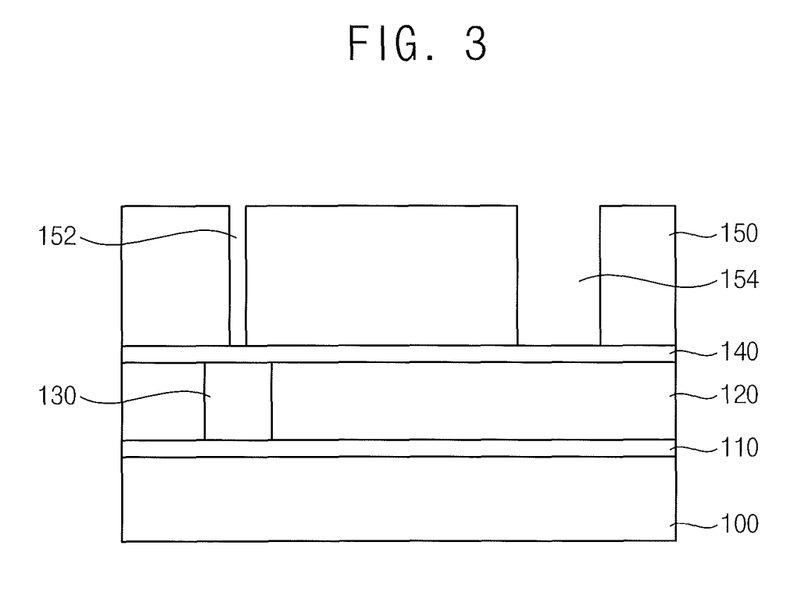

Referring to FIG. 3, the second insulating interlayer 150 may be partially removed by a photolithography process using a photoresist pattern to form a hole 152 and a first trench 154 through the second insulating interlayer 150. Particularly, a hard mask layer (not shown) may be formed on the second insulating interlayer 150, and the hard mask layer may be patterned to form a hard mask (not shown) using the photoresist pattern as an etching mask. Thus, the hard mask may serve as an etching mask for forming the hole 152 and the first trench 154. Thus, portions of the second etch stop layer 140 may be exposed by the hole 152 and the first trench 154.

Figure 4:
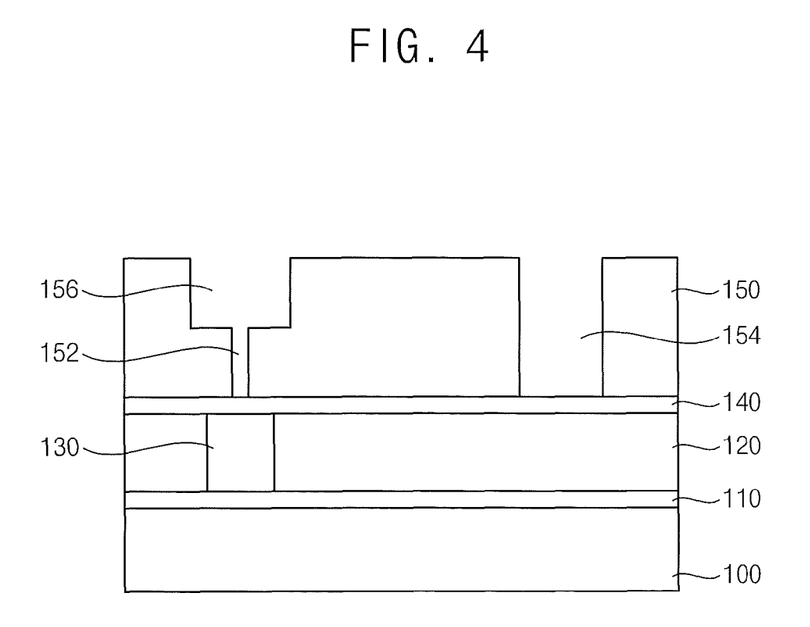

Referring to FIG. 4, an upper portion of the second insulating interlayer 150 may be removed by a photolithography process to form a second trench 156 in fluid communication with the hole 152.

Figure 5:
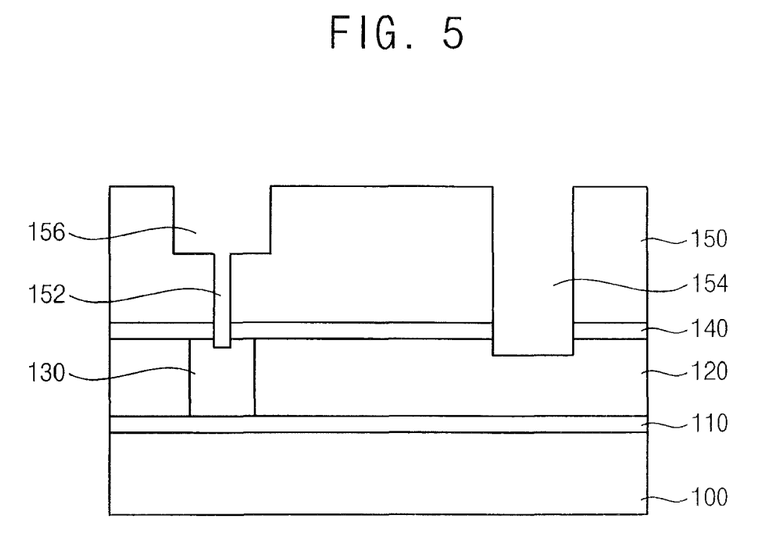

Referring to FIG. 5, the exposed portions of the second etch stop layer 140 may be removed by an etching process to expose portions of the first wiring 130 and the first insulating interlayer 120. In some example embodiments, when the exposed portions of the second etch stop layer 140 are removed, the exposed portion of the first insulating interlayer 120 may be also partially removed, so that the exposed portions of the second etch stop layer 140 may be sufficiently removed. Thus, the first trench 154 may extend into an upper portion of the first insulating interlayer 120. When the exposed portions of the second etch stop layer 140 are removed, the exposed portion of the first wiring 130 may be also partially removed.

Figure 6:
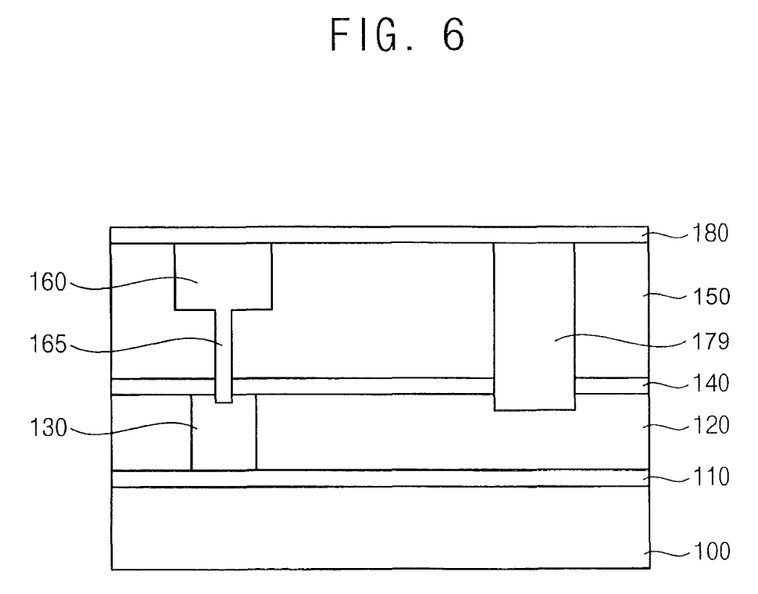

Referring to FIG. 6, a contact plug 165 and a second wiring 160 filling the hole 152 and the second trench 156, respectively, and a fuse 179 filling the first trench 154 may be formed. In particular, a conductive layer may be formed on the first wiring 130, the first insulating interlayer 120 and the second insulating interlayer 150 to fill the hole 152 and the first and second trenches 154 and 156. An upper portion of the conductive layer may be planarized by a chemical mechanical polishing (CMP) process and/or an etch back process until a top surface of the second insulating interlayer 150 is exposed to form the contact plug 165, the second wiring 160 and the fuse 170. The conductive layer may be formed using a material having a low resistance, e.g., copper, gold, silver, and the like.

A diffusion barrier layer 180 covering the second wiring 160 and the fuse 170 may be formed on the second insulating interlayer 150. The diffusion barrier layer 180 may be formed using silicon nitride. The diffusion barrier layer 180 may be formed using a material substantially the same as or different from those of the first and second etch stop layers 110 and 140. The diffusion barrier layer 180 may reduce or prevent a material of the second wiring 160 and the fuse 170 from diffusing into a layer thereon.

Insulating interlayers (not shown) covering other wirings (not shown) may be further formed on the diffusion barrier layer 180, and an opening (not shown) may be formed through the insulating interlayers to expose a portion of the diffusion barrier layer 180 on the fuse 170. In a laser repair process, a laser may be scanned onto the fuse 170 through the exposed portion of the diffusion barrier layer 180. The incidence of cracks may be reduced or eliminated because a lower portion of the fuse 170 may be bounded by the first insulating interlayer 120 having a high mechanical strength or density. This may allow the use of an expanded energy window in the laser repair process. Additionally, because the lower portion of the fuse 170 is not covered by the second insulating interlayer 150 but by the first insulating interlayer 120, the second insulating interlayer 150 containing the second wiring 160 may be formed using a low-k material having a dielectric constant less than about 3.5.

Figure 7:
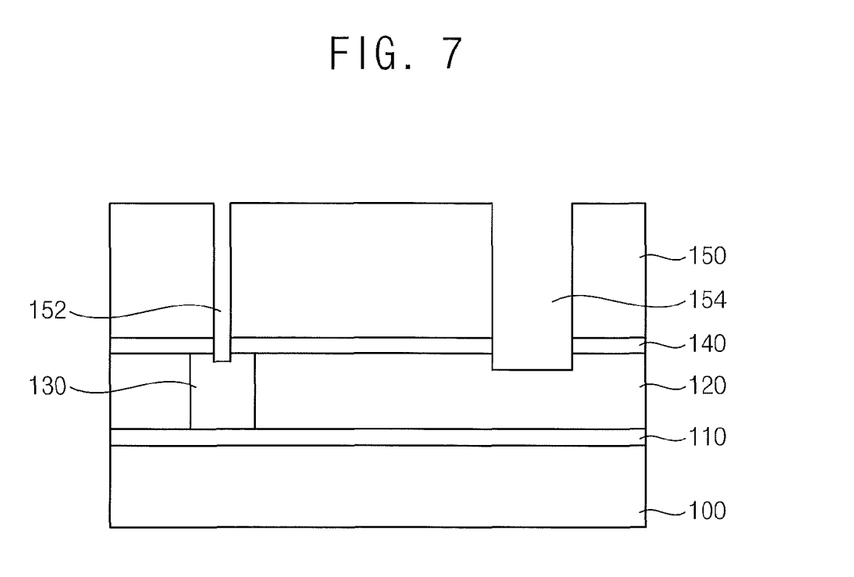
FIGS. 7 to 8 are cross-sectional views illustrating a method of forming a fuse structure in accordance with some example embodiments.

In some embodiments, when the second insulating interlayer 150 is partially removed, the second etch stop layer 140 and the first insulating interlayer 120 may be also partially removed to form the first trench 154 extending to the upper portion of the first insulating interlayer 120 and the hole 152 exposing the first wiring 130. In particular, referring to FIG. 7, portions of the second insulating interlayer 150 and portions of the second etch stop layer 140 therebeneath may be partially removed by a photolithography process using a photoresist pattern. The upper portion of the first insulating interlayer 120 may be also removed so that the portion of the second etch stop layer 140 may be sufficiently removed. Thus, the first trench 154 extending to the first insulating interlayer 120 and the hole 152 exposing the first wiring 130 may be formed. An upper portion of the first wiring 130 may be also removed when the hole 152 is formed.

Figure 8:
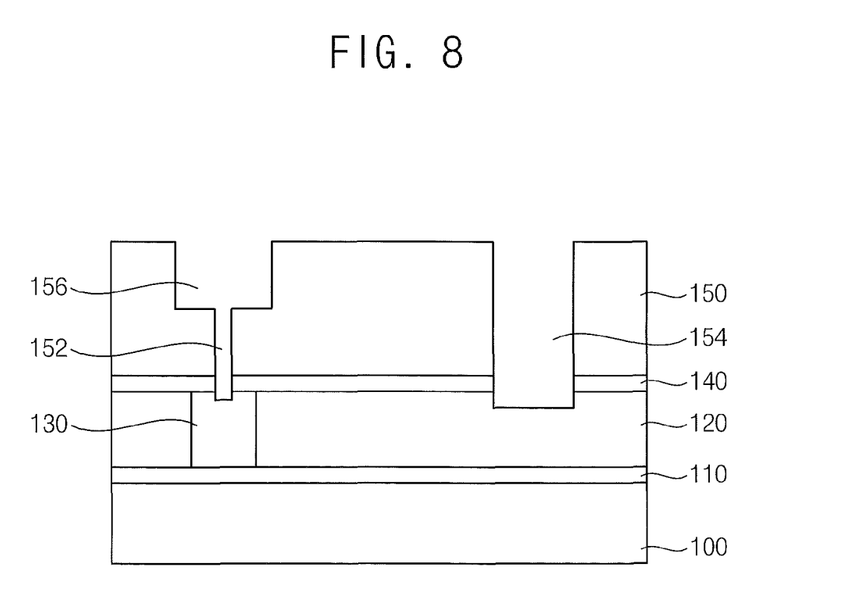

Referring to FIG. 8, an upper portion of the second insulating interlayer 150 may be removed by a photolithography process to form the second trench 156 in fluid communication with the hole 152.

Figure 9:
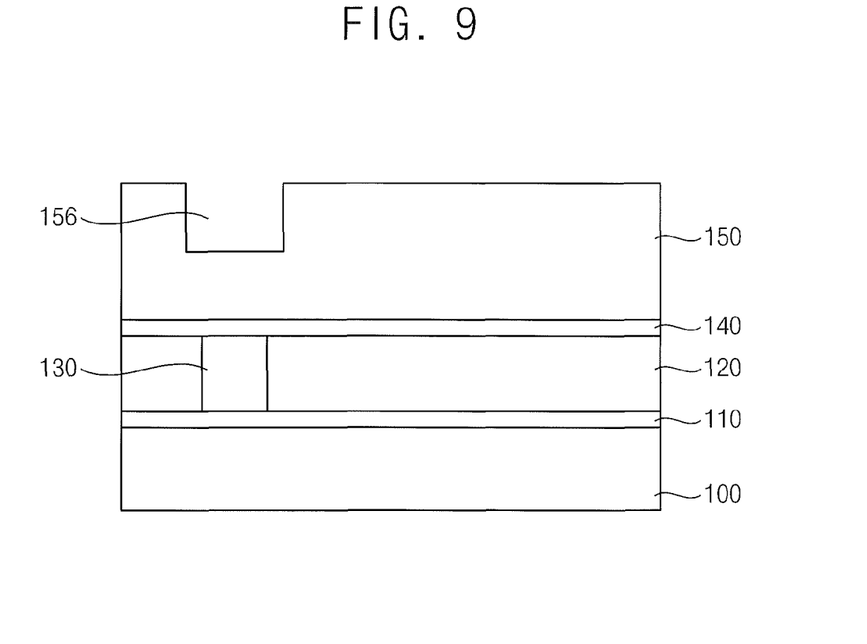
FIGS. 9 and 10 are cross-sectional views illustrating a method of forming a fuse structure in accordance with some example embodiments.
Figure 10:
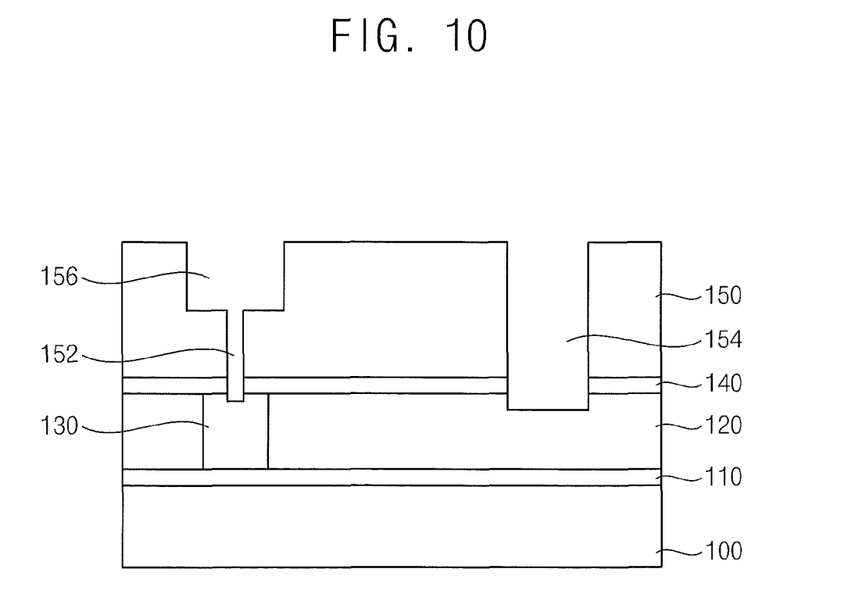

FIGS. 9 and 10 are cross-sectional views illustrating operations for forming a fuse structure in accordance with some example embodiments. These operations may be substantially the same as or very similar to those illustrated with reference to FIGS. 1 to 8, except that the hole 152 and the first trench 154 are formed after forming the second trench 156. Thus, like reference numerals refer to like elements, and repetitive explanations are omitted.

Referring to FIG. 9, after performing the operations illustrated with reference to FIGS. 1 and 2, the second trench 156 may be formed in the second insulating interlayer 150 by a photolithography process.

Referring to FIG. 10, portions of the second insulating interlayer 150 may be removed to form the hole 152 in fluid communication with the second trench 156 and the first trench 154 by a photolithography process. Thus, portions of the second etch stop layer 140 may be exposed. The exposed portions of the second etch stop layer 140 may be removed, and an upper portion of the first insulating interlayer 140 may be also removed. Thus, the first trench 154 may extend into the first insulating interlayer 120. The first wiring 130 may be also partially removed.

FIGS. 11 to 16 are cross-sectional views illustrating operations for forming a fuse structure in accordance with some example embodiments. These operations may be substantially the same as or very similar to those illustrated with reference to FIGS. 1 to 8, except that a compensation region may be formed on a first low-k dielectric layer (a first insulating interlayer).

Figure 11:
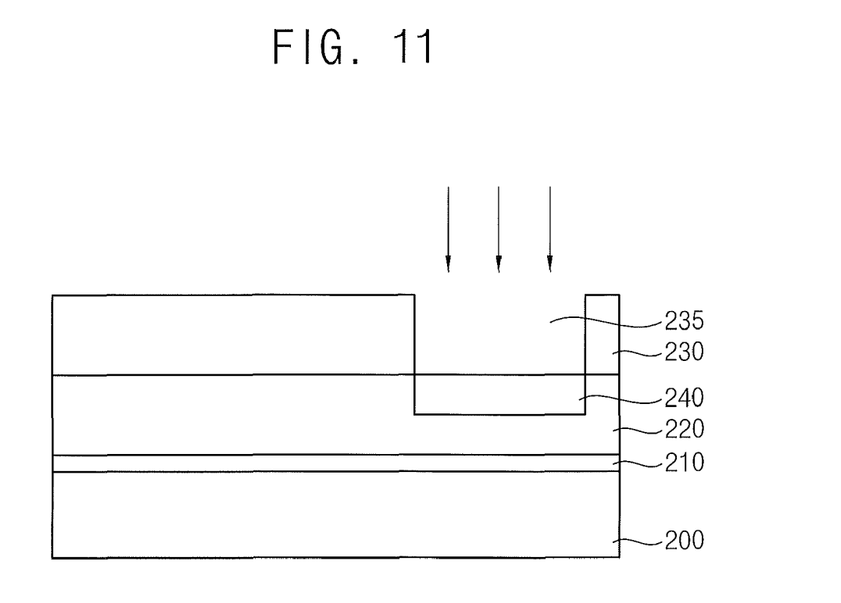
FIGS. 11 to 16 are cross-sectional views illustrating a method of forming a fuse structure in accordance with some example embodiments.

Referring to FIG. 11, a first etch stop layer 210 and a first low-k dielectric layer 220 may be sequentially formed on a substrate 200. The first etch stop layer 210 may be formed using silicon nitride. The first low-k dielectric layer 220 may be formed using a low-k material having a low dielectric constant, for example, a dielectric constant equal to or less than about 3.5. The first low-k dielectric layer 220 may be formed using a material substantially the same as that of the second insulating interlayer 150 in FIGS. 1 to 8. For example, the first low-k dielectric layer 220 may be formed using silicon oxide doped with carbon or fluorine or porous silicon carboxide.

A photoresist pattern 230 may be formed on the low-k dielectric layer 220, and an ion implantation process may be performed on an upper portion of the first low-k dielectric layer 220 exposed by the photoresist pattern 230 to form a compensation region 240. In some example embodiments, oxygen ions or nitrogen ions may be implanted into the upper portion of the first low-k dielectric layer 220. In some embodiments, ultraviolet rays may be scanned onto the exposed portion of the first low-k dielectric layer 220 to form the compensation region 240. In some example embodiments, the ultraviolet rays may be scanned at a temperature of about 300° C. to about 450° C. The compensation region 240 may have a higher mechanical strength than the first insulation layer 220 due an ion implantation process and/or by treatment with ultraviolet rays.

Figure 12:
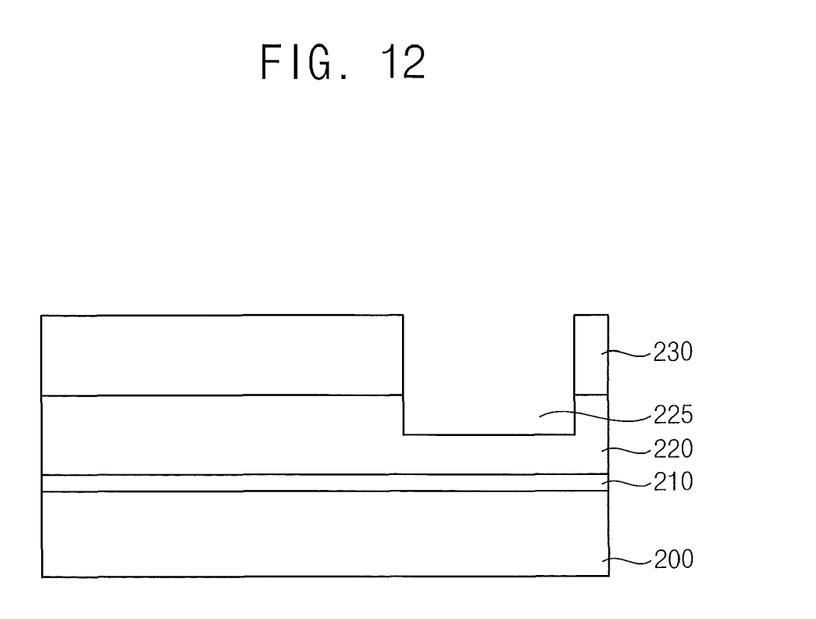

Alternatively, referring to FIG. 12, the compensation region 240 may be formed by inserting an additional layer on the first insulating interlayer 220. In particular, an upper portion of the first insulating interlayer 220 may be removed by a photolithography process to form a recess 225. A material having a higher mechanical strength than that of the first insulating interlayer 220 may be deposited in the recess 225 to form the compensation region 240. In some example embodiments, the compensation region 240 may be formed using silicon oxide, silicon nitride or silicon oxynitride. In further example embodiments, the compensation region 240 may be formed using a material having a modulus equal to or greater than about 20 GPa and having a hardness equal to or greater than 4 GPa. In still further example embodiments, the compensation region 240 may be formed using a material having a dielectric constant greater than about 3.5.

Figure 13:
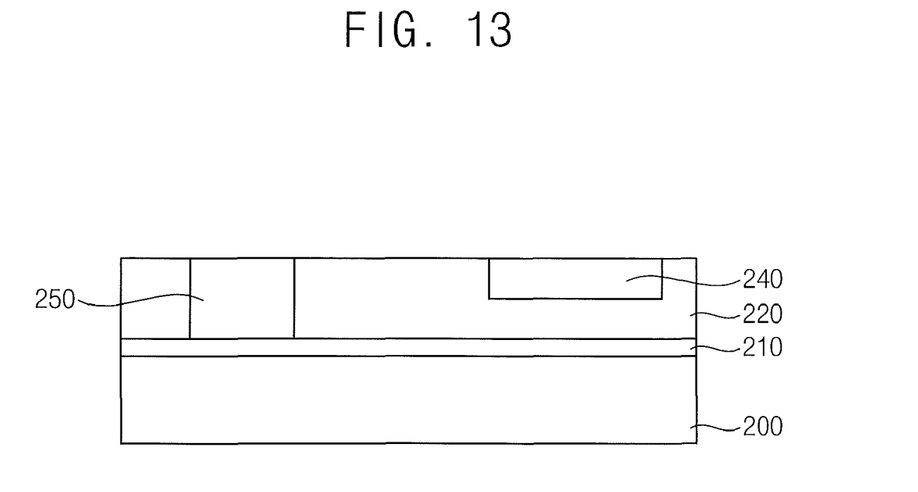

Referring to FIG. 13, the first low-k dielectric layer 220 may be partially removed by a photolithography process to form an opening (not shown), and a first wiring 250 may be formed in the opening using a conductive material, such as a metal or polysilicon. A barrier layer (not shown) may be further formed between the first low-k dielectric layer 220 and the first wiring 250 using, for example, a metal nitride.

Figure 14:
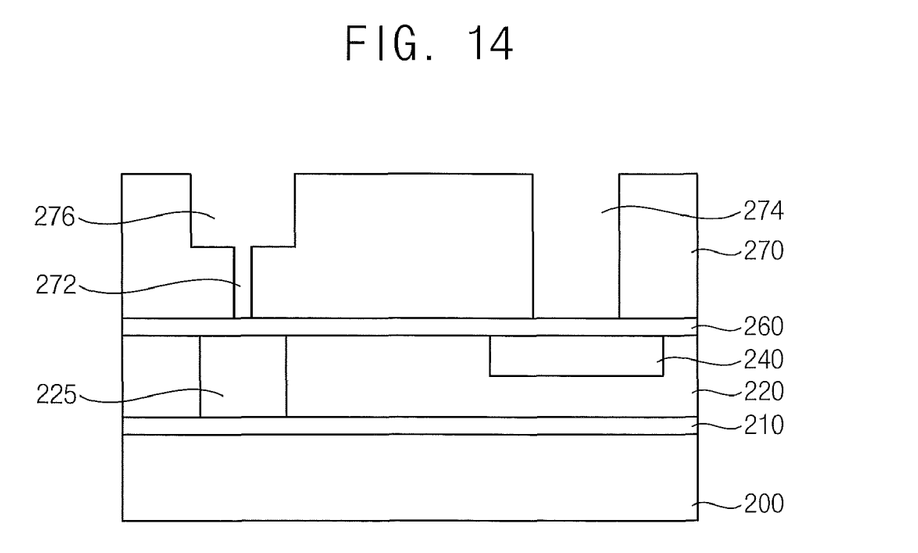

Referring to FIG. 14, a second etch stop layer 260 and a second low-k dielectric layer 270 may be sequentially formed on the first wiring 250, the compensation region 240 and the first low-k dielectric layer 220. The second etch stop layer 260 may be formed using, for example, silicon nitride. The second low-k dielectric layer 270 may be formed using a low-k material having a dielectric constant equal to or less than about 3.5. The second low-k dielectric layer 270 may be formed using, for example, silicon oxide doped with carbon or fluorine or porous silicon oxide. A hole 272 and a first trench 274 may be formed through the second low-k dielectric layer 270 to expose portions of the second etch stop layer 260, and a second trench 276 in fluid communication with the hole 272 may be formed at an upper portion of the second low-k dielectric layer 270.

Figure 15:
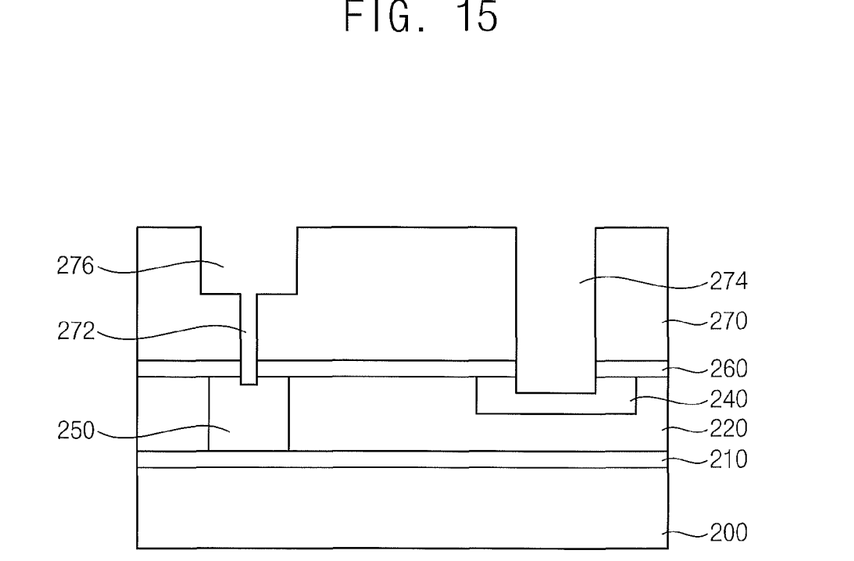

Referring to FIG. 15, the exposed portions of the second etch stop layer 260 may be removed by an etching process to expose portions of the first wiring 250 and the compensation region 240. In some example embodiments, when the exposed portions of the second etch stop layer 260 are removed, the exposed portion of the compensation region 240 may be also partially removed, so that the exposed portions of the second etch stop layer 260 may be sufficiently removed. Thus, the first trench 274 may extend into an upper portion of the compensation region 240. When the exposed portions of the second etch stop layer 260 are removed, the exposed portion of the first wiring 250 may be also partially removed.

Figure 16:
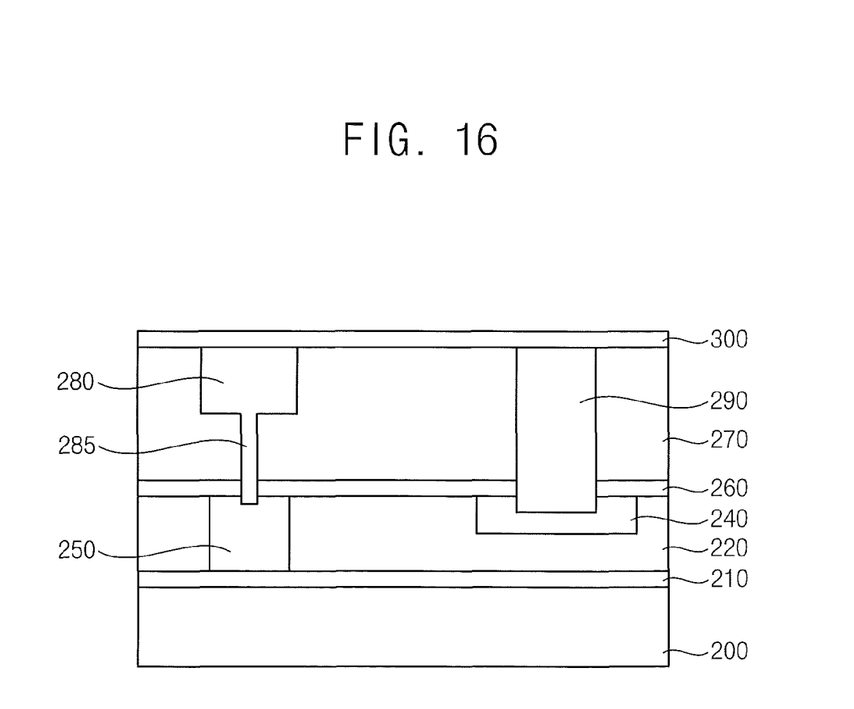

Referring to FIG. 16, a contact plug 285 and a second wiring 280 filling the hole 272 and the second trench 276, respectively, and a fuse 290 filling the first trench 274 may be formed. The contact plug 285, the second wiring 280 and the fuse 290 may be formed using a material having a low resistance, e.g., copper, gold, silver, and the like. A diffusion barrier layer 300 covering the second wiring 280 and the fuse 290 may be formed on the second low-k dielectric layer 270.

As similar to the method illustrated with reference to FIGS. 1 to 10, in a laser repair process, a laser may be scanned onto the fuse 290, and the incidence of cracks may be reduced or eliminated because a lower portion of the fuse 290 may be bounded by the compensation region 240 having a high mechanical strength or density. This may allow for an expanded energy window in the laser repair process. Additionally, because the lower portion of the fuse 290 is not covered by the second low-k dielectric layer 270, the second low-k dielectric layer containing the second wiring 280 may be formed using a low-k material.

The inventive subject matter is applicable to any of a variety of fuse structures and wirings formed in low-k dielectric layers. In some embodiments, low-k dielectric layers containing wirings and fuse structures may be formed so that a parasitic capacitance may be reduced, and a compensation region covering a lower portion of the fuse structure may be formed near the low-k dielectric layers to reduce or eliminate the formation of cracks.

According to some example embodiments, a lower portion of a fuse may be covered by a layer having a high mechanical strength, which may help reduce or eliminate the formation of cracks in a laser repair process. Thus, an insulating interlayer may be formed between wirings using a low-k material, and parasitic capacitance may be reduced.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present inventive subject matter. Accordingly, all such modifications are intended to be included within the scope of the present inventive subject matter as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method comprising:
    forming a fuse base insulating region on a substrate;
    forming an etch stop layer on the fuse base insulating region;
    forming an insulating interlayer having a lower dielectric constant than the fuse base insulating region on the etch stop layer;
    forming a trench extending through the insulating interlayer and the etch stop layer and at least partially into the fuse base insulating region; and
    forming a fuse in the trench.

2. The method of claim 1, wherein the fuse base insulating region has a greater mechanical strength and/or density than the second insulating interlayer.

3. The method of claim 1, wherein the fuse base insulating region comprises silicon oxide, silicon carboxide, silicon nitride and/or silicon oxynitride, and wherein the insulating interlayer comprises porous silicon carboxide and/or silicon oxide doped with carbon and/or fluorine.

4. The method of claim 1, wherein the fuse base insulating region comprises another insulating interlayer or a compensation region formed in another insulating interlayer.

5. The method of claim 1:
    wherein forming a fuse base insulating region comprises forming a first insulating interlayer;
    wherein forming an insulating interlayer comprises forming a second insulating interlayer having a lower dielectric constant than the first insulating interlayer; and
    wherein forming a trench comprises forming a trench extending through the second insulating interlayer and the etch stop layer and at least partially into the first insulating interlayer.

6. The method of claim 5, wherein the first insulating interlayer has a greater mechanical strength and/or density than the second insulating interlayer.

7. The method of claim 5, wherein the first insulating interlayer comprises silicon oxide, silicon carboxide, silicon nitride and/or silicon oxynitride, and wherein the second insulating interlayer comprises porous silicon carboxide and/or silicon oxide doped with carbon and/or fluorine.

8. The method of claim 1:
    wherein forming a fuse base insulating region comprises:
        forming a first insulating interlayer; and
        forming a compensation region in the first insulating interlayer;
    wherein forming an insulating interlayer layer comprises forming a second insulating interlayer having a lower dielectric constant than the compensation region; and
    wherein forming a trench comprises forming a trench extending through the second insulating interlayer and the etch stop layer and at least partially into the compensation region.

9. The method of claim 8, wherein the compensation region has a greater mechanical strength and/or density than the second insulating interlayer.

10. The method of claim 8, wherein the compensation region has a greater dielectric constant, mechanical strength and/or density than the first insulating interlayer.

11. The method of claim 8, wherein forming a compensation region comprises implanting ions into a portion of the first insulating interlayer.

12. The method of claim 8, wherein forming a compensation region comprises exposing a portion of the first insulating interlayer to ultraviolet radiation.

13. The method of claim 8, wherein forming a compensation region comprises:
    removing a portion of the first insulating interlayer to form a trench; and
    depositing an insulating material in the trench to form the compensation region.

14. The method of claim 8, wherein the first insulating interlayer comprises porous silicon carboxide and/or silicon oxide doped with carbon and/or flourine, and wherein the second insulating interlayer comprises porous silicon carboxide and/or silicon oxide doped with carbon and/or flourine.

15. The method of claim 1, further comprising forming a wiring pattern adjacent the fuse base insulating region before forming the etch stop layer and wherein forming an etch stop layer comprises forming the etch stop layer on the fuse base insulating region and the wiring pattern.

16. A method comprising,
    forming a first insulating interlayer on a substrate;
    forming a wiring pattern in the first insulating interlayer;
    forming an etch stop layer on the first insulating interlayer and the wiring pattern;
    forming a second insulating interlayer having a lower dielectric constant than the first insulating interlayer on the etch stop layer;
    forming a hole and a first trench through the second insulating interlayer to expose portions of the etch stop layer overlying the wiring pattern and a laterally adjacent portion of the first insulating interlayer, respectively;
    forming a second trench in fluid communication with the hole in the second insulating interlayer;
    removing the portions of the etch stop layer exposed by the hole and the first trench to expose the wiring pattern and the laterally adjacent portion of the first insulating interlayer; and
    forming a contact plug in the second trench and the hole and forming a fuse in the first trench.

17. The method of claim 16, wherein removing the portions of the etch stop layer exposed by the hole and the first trench comprises removing an upper portion of the first insulating interlayer and wherein the fuse extends at least partially into the first insulating interlayer.

18. A method comprising, forming a first insulating interlayer on a substrate;

forming a first wiring pattern in the first insulating interlayer;

forming a second insulating interlayer having a dielectric constant lower than the first insulating interlayer on the first insulating interlayer;

forming a first trench extending partially into the second insulating interlayer, overlying the first wiring pattern;

forming a hole and a second trench in the second insulating interlayer, the hole passing from the first trench through the second insulating interlayer to expose the first wiring pattern and the second trench laterally adjacent the first trench and passing through the second insulating interlayer and at least partially into the first insulating interlayer; and forming a contact plug and a second wiring pattern in the hole and the first trench, respectively, and forming a fuse in the second trench.

19. The method of claim 18, further comprising forming an etch stop layer on the first insulating interlayer before forming the second insulating interlayer and wherein forming the hole and the second trench includes removing portions of the etch stop layer.

\* \* \* \* \*